United States Patent [19]
Levy et al.

[11] Patent Number: 5,523,707
[45] Date of Patent: Jun. 4, 1996

[54] FAST, LOW POWER EXCLUSIVE OR CIRCUIT

[75] Inventors: Howard L. Levy; Eric B. Schorn, both of Austin, Tex.

[73] Assignee: International Business Machines Corporation, Armonk, N.Y.

[21] Appl. No.: 497,360

[22] Filed: Jun. 30, 1995

[51] Int. Cl.$^6$ .............................. H03K 19/21; G06F 7/50
[52] U.S. Cl. .................................. 326/52; 326/55; 326/54
[58] Field of Search .................................. 326/52, 55, 54

[56] References Cited

U.S. PATENT DOCUMENTS

| | | |
|---|---|---|
| 4,233,524 | 11/1980 | Burdick . |
| 4,417,161 | 11/1983 | Uya . |
| 4,424,460 | 1/1984 | Best . |
| 4,477,904 | 10/1984 | Thorsrud . |
| 4,622,648 | 11/1986 | Whitaker ........................ 326/55 |
| 4,713,790 | 12/1987 | Kloker et al. ................... 326/55 |
| 4,775,810 | 10/1988 | Suzuki et al. ................... 326/55 |
| 4,870,305 | 9/1989 | Rocchi . |
| 5,155,387 | 10/1992 | Fletcher et al. . |
| 5,334,888 | 8/1994 | Bodas . |

*Primary Examiner*—Edward P. Westin
*Assistant Examiner*—Richard Roseen
*Attorney, Agent, or Firm*—Mark E. McBurney

[57] ABSTRACT

A static XOR gate is provided with circuit speeds necessary to meet the increasing demand of higher computer clock frequencies. The XOR of the present invention takes up less area and consumes less power than prior art XOR circuits. Furthermore, time XOR gate of the present invention is fully static and imposes less constraints on the circuit designer, e.g. no reset logic, input synchronization, or the like. The circuit utilizes only NMOS transistors in the functional logic portion with two output inverters. The circuit elements are symmetrical and have identical input loading, output drive and propagation paths. The XOR of the present invention allows multiple gates to be connected in stages as a "tree" configuration by providing a "push-pull" XOR/EQV (equivalent, i.e. time complement of the XOR output or XNOR) function which is buffered by output inverters to "push" the output to a next stage. Additional transistors are provided to help "pull" internal nodes to the operating voltage but are not logically functional transistors. Further, input connections to the logical transistors are such as to eliminate unnecessary delay between like stages, when configured as a "tree".

8 Claims, 6 Drawing Sheets

5,523,707

FAST, LOW POWER EXCLUSIVE OR CIRCUIT

BACKGROUND OF THE INVENTION

1. Technical Field

The present invention generally relates to logic circuits used in integrated circuit devices, such as microprocessors, memory chips and the like. More specifically, an efficient, Exclusive-Or complementary metal oxide semiconductor (CMOS) logic gate is provided that consumes less power and switches faster than conventional Exclusive-Or (XOR) gates.

2. Description of Related Art

Typically, XOR gates are slow, large, power hungry and complex devices when compared to other basic gates having the same number of inputs. Further, these problems are compounded since multiple XOR gates are often connected together in a "tree" configuration.

A conventional CMOS XOR gate is illustrated in FIG. 4. Ten (10) transistors are included in the gate. That is, P-type devices (PMOS transistors 1, 2, 3, 4 and 9) are included and will be in a "turned on" state (where they will conduct electrical current) when a logical "0" (absence of a voltage) is present at their gates. N-type devices (NMOS transistors 5, 6, 7, 8 and 10 are also included and will be in a "turned on" state when a logical "1" (a voltage, i.e. Vdd) is present at their gates. Transistors 9 and 10 make up an inverter circuit which provides a complementary signal output, i.e. a strong logical 1 (Vdd) or logical 0 (ground potential) which can also be transmitted to another interconnected logic device.

Those skilled in the art understand that the power consumption of a transistor is roughly proportional to its physical size. For example, a transistor with a 10 micron width will use about twice as much power as a transistor with a 5 micron width. In the prior art circuit of FIG. 4 if it is assumed that transistors 5–8 have a 10 micron width, then the PMOS transistors 1–4 will need to be of an approximately 20 micron width in order to get equivalent drive capability (PMOS transistors need to be at least twice as large as equivalent NMOS transistors to get the same output drive). This gives a 5 micron output drive strength, compared to a required 30 micron input loading. Thus, the combination of ten (10) transistors and five (5) of those being large PMOS devices causes the XOR gate of FIG. 4 to be a very large circuit in relation to its drive strength.

Since XOR gates are often connected in a tree configuration, such as parity or other error checking/correcting circuits, the circuit of FIG. 4 would also take up a substantial amount of area on the chip, or integrated circuit (IC), due to the large transistor sizes. The large "fan-out" causes the circuit of FIG. 4 to be relatively slow, particularly when compared to the high speed clock frequency of today's microprocessor designs (excess of 100 MHz). Further, the large size of the devices of FIG. 4, coupled with the fan-out creates a large amount of capacitance that must be switched. This in turn causes the power consumption to be high and the circuit to switch relatively slowly.

The XOR gate of FIG. 4 is a static device, which means that the actual input logic signals will cause the circuit to switch, and that there are no set/reset signals required, i.e. no separate clock signals need to be input to the circuit. Conversely, dynamic circuits require that a set or reset signal be input and further necessitate the need for additional set or reset logic which complicates the design of a system.

Dynamic XOR gates are known in the art. These types of gates typically minimize the number of PMOS transistors which are needed. Further, dynamic XOR gates can be smaller and faster than equivalent prior art static XOR gates. However, these dynamic circuits require synchronized inputs and potentially switch twice during a single clock transition cycle, thereby consuming a considerable amount of power. Additionally, the required reset circuits will take a substantial amount of time to design and tune. Thus, dynamic XOR circuits require increased design time (due to their complexity), large amounts of electrical power, and potentially greater area on the chip (due to the additional reset circuitry) making them a less than desirable alternative to static XOR gates.

Thus, it can be seen that a need exists for a low power, fast, static XOR gate that can be used in many places throughout an integrated circuit device.

SUMMARY OF THE INVENTION

In contrast to the prior art, the present invention is a static XOR gate that provides the circuit speeds necessary to meet the increasing demand of higher computer clock frequencies. The XOR of the present invention takes up less area and consumes less power than prior art XOR circuits. Furthermore, the XOR gate of the present invention is fully static and imposes less constraints on the circuit designer, e.g. no reset logic, input synchronization, or the like.

Broadly, the present invention is a "dual-rail" circuit utilizing NMOS transistors in the functional logic portion. The circuit elements are symmetrical and have identical input loading, output drive and propagation paths. The XOR of the present invention allows multiple gates to be connected in stages as a "tree" configuration by providing a "push-pull" XOR/EQV (equivalent, which is the complement of the XOR output, i.e. XNOR) function which is buffered by output inverters to transmit the output to a next stage. Additional transistors are provided to help "pull" internal nodes to the operating voltage but are not logically functional transistors. Further, input connections to the logical transistors are such as to eliminate unnecessary delay between like stages, when configured as a "tree".

In accordance with the previous summary, objects, features and advantages of the present invention will become apparent to one skilled in the art from the subsequent description and the appended claims taken in conjunction with the accompanying drawings.

DETAILED DESCRIPTION OF THE PREFERRED EMBODIMENT

Figure 1:
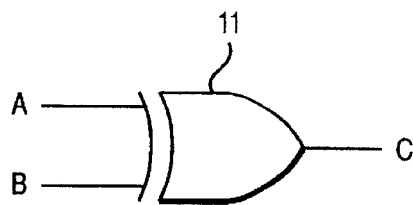
FIG. 1 is a schematic representation of an exclusive or gate.

Referring to FIG. 1, a logical XOR gate 11 is shown having inputs A and B, and an output C. This gate outputs a logical 1 when either input A or B (but not both) are logical 1's, i.e. A=1 and B=0 or A=0 and B=1. When both A and B have the same value, i.e. A=B=1 or A=B=0, a logical 0 is output. The truth table for an XOR gate follows:

| A | B | C |
|---|---|---|
| 0 | 0 | 0 |
| 0 | 1 | 1 |
| 1 | 0 | 1 |
| 1 | 1 | 0 |

Figure 2:
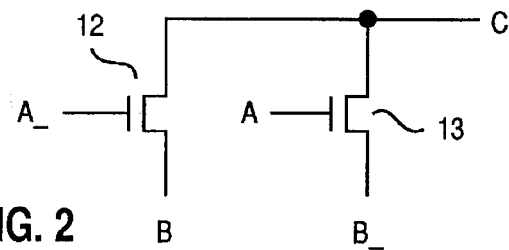
FIG. 2 is a circuit diagram representing a simplified version of an XOR gate using only N-type transistors.

FIG. 2 is a circuit having two NMOS transistors 12 and 13 and inputs A, A complement (A__) and B, B complement (B__), with an output C. The truth table for this device is as follows:

| A | A__ | B | B__ | C |
|---|-----|---|-----|---|
| 0 | 1 | 0 | 1 | 0 |
| 0 | 1 | 1 | 0 | 1 |
| 1 | 0 | 0 | 1 | 1 |
| 1 | 0 | 1 | 0 | 0 |

It can be seen that with the circuit of FIG. 2, when A=0 and B=0, then A__ and B__ are each a logical 1. In this state, transistor 12 is turned on and B is a logical 0, such that C is also a logical 0. When A=0 and B=1, then A__=1 and B__=0. Thus, transistor 12 will be turned on and the output C will be a logical 1. Similarly, when A=1 and B=0, A__=0 and B__=1, such that transistor 13 will be turned on and the output C will be the same as B__, i.e. logical 1. Finally, when A=1 and B=1, then A__=0 and B__=0, where transistor 13 is turned on and the output 3 is pulled to logical 0.

Figure 3:
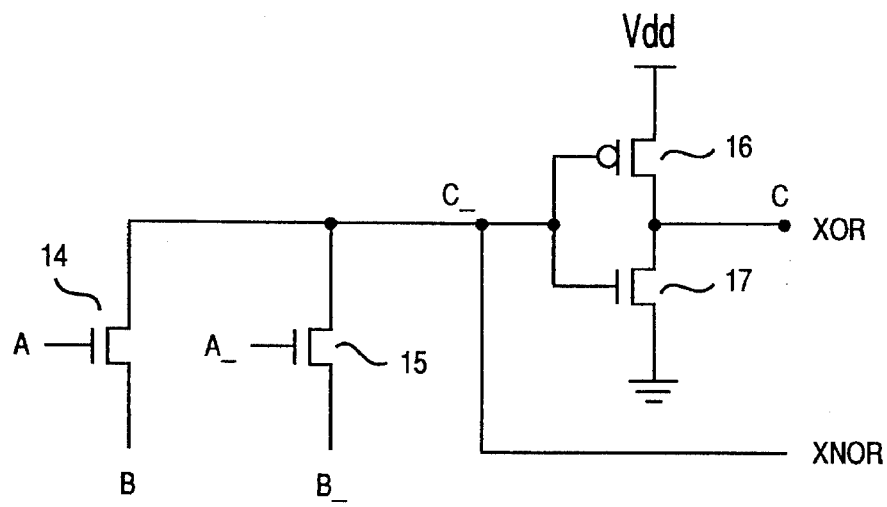
FIG. 3 is another circuit diagram of an XOR gate having an output inverter circuit.
Figure 4:
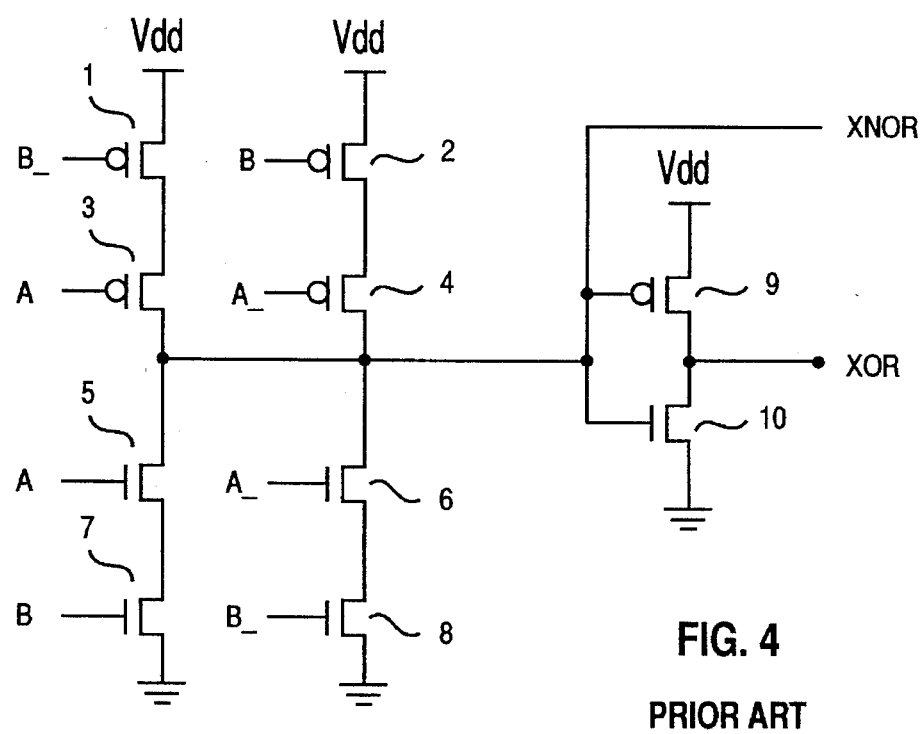
FIG. 4 is a schematic of a prior art static XOR circuit using both N and P type transistors.

It is often the case that the circuit requiring the output from the XOR gate will need a strong voltage level at full swing voltage (i.e. 0 to Vdd, such as 0 to 3.3 volts, or the like) in order to switch states. Therefore, an output stage is provided that will supply Vdd, or ground to the next circuit. An inverter is used for this output stage, as shown in FIG. 3. Since, the inverter changes a logical 1 to a logical 0, and vice versa, the input signals need to be reconfigured as an XNOR gate. In FIG. 3, two NMOS transistors 14 and 15 are connected together forming an output C__, which is input to the inverter for outputting the signal C. The truth table for the circuit of FIG. 3, is as follows:

| A | A__ | B | B__ | C (XOR) | C__ (XNOR/EQV) |
|---|-----|---|-----|---------|----------------|
| 0 | 1 | 0 | 1 | 0 | 1 |
| 0 | 1 | 1 | 0 | 1 | 0 |
| 1 | 0 | 0 | 1 | 1 | 0 |
| 1 | 0 | 1 | 0 | 0 | 1 |

It can be seen that when A=0, B=0 and A__=1, B__=1 transistor 15 will be turned on, and a logical 1 will be provided as C__, which is the XNOR or equivalent (EQV) output. Logical 1 will be inverted to logical 0, since transistor 17 is turned on and the output is pulled to ground. When A=0, B=1 and A__=1, B__=0, transistor 15 is turned on again, but B__=0 and thus C__ is a logical 0. The inverter stage changes the logical 0 to a logical 1 by turning on transistor 16 and pulling C up to Vdd. When A=1, B=0 and A__=0 and B__=1, transistor 14 is turned on and C__ is a 0, such that a logical 1 is output as C. Finally, when A=1, B=1 and A=0, B=0, transistor 14 is turned on and a logical 1 is provided as C__. This is inverted to a logical 0 by turning on transistor 17. Thus, the XNOR circuit using transistors 14 and 15 becomes an XOR circuit when the inverter stage of transistors 16 and 17 is added.

Figure 5:
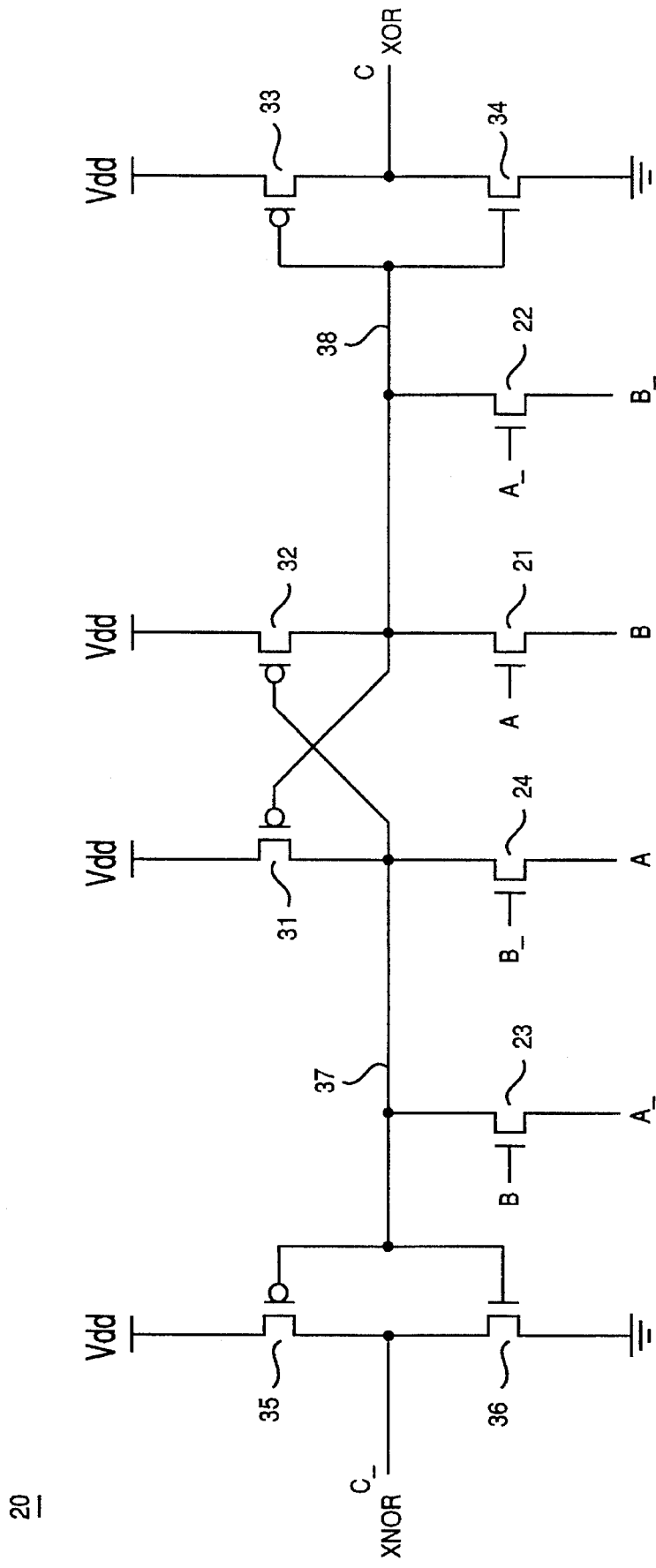
FIG. 5 is a circuit diagram of a preferred embodiment of the present invention wherein the XOR and EQV signal are each output through inverter circuits and pull-up devices are used to bring the internal nodes to Vdd.
Figure 6A:
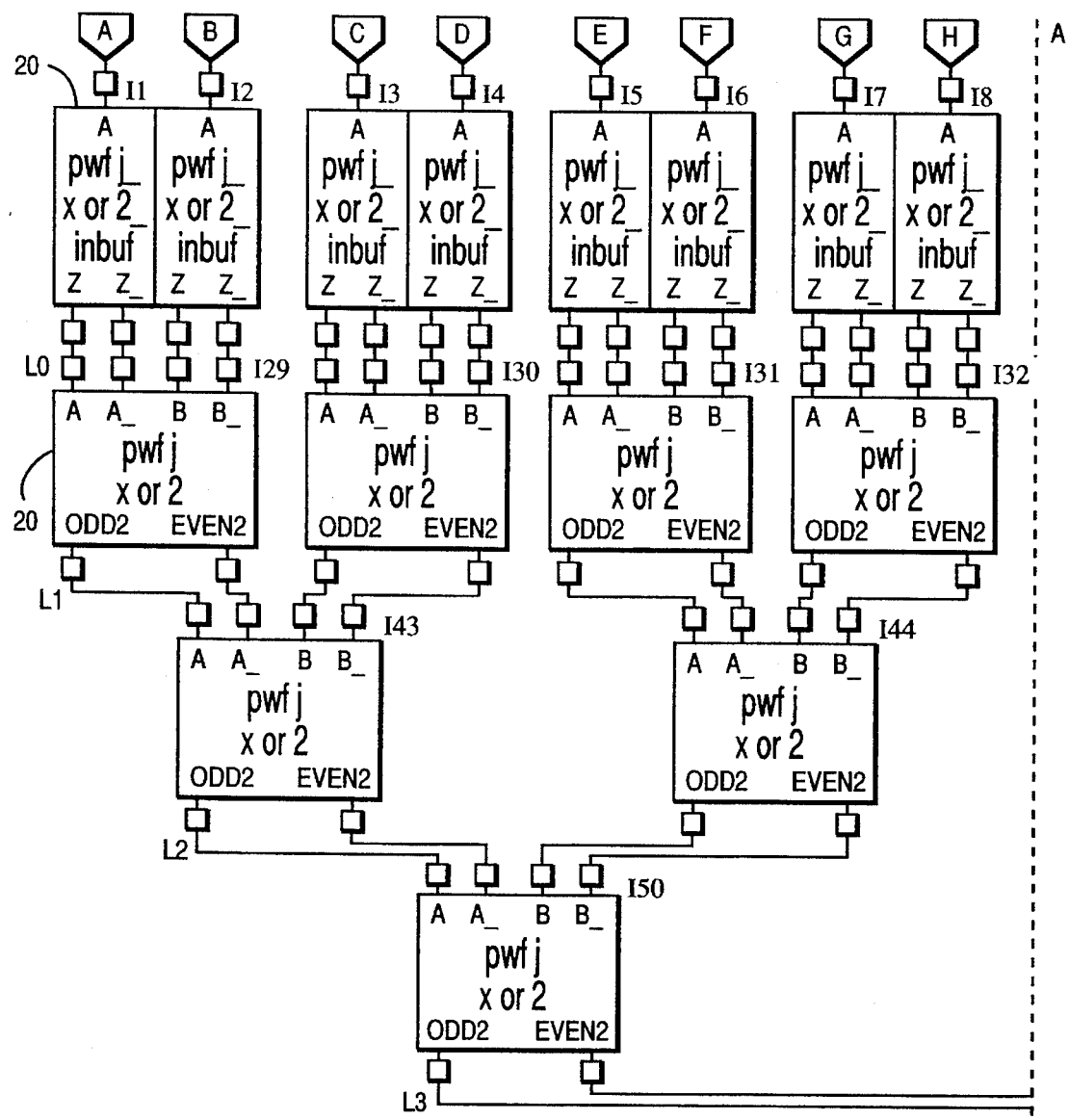
FIG. 6 represents a plurality of XOR gates connected in a tree configuration which illustrates the advantage of the connectivity aspects of the XOR of the present invention.
Figure 6B:
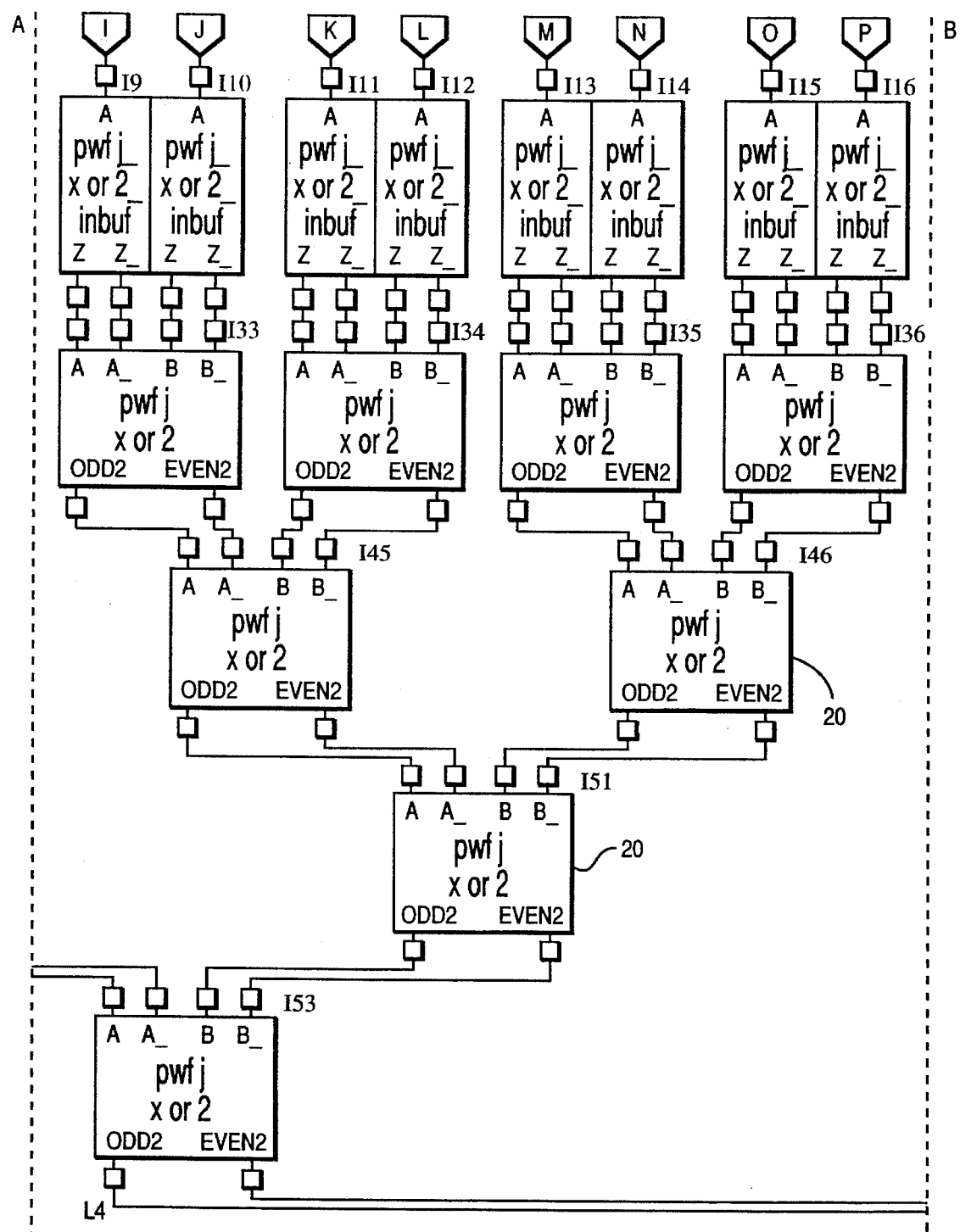
Figure 6C:
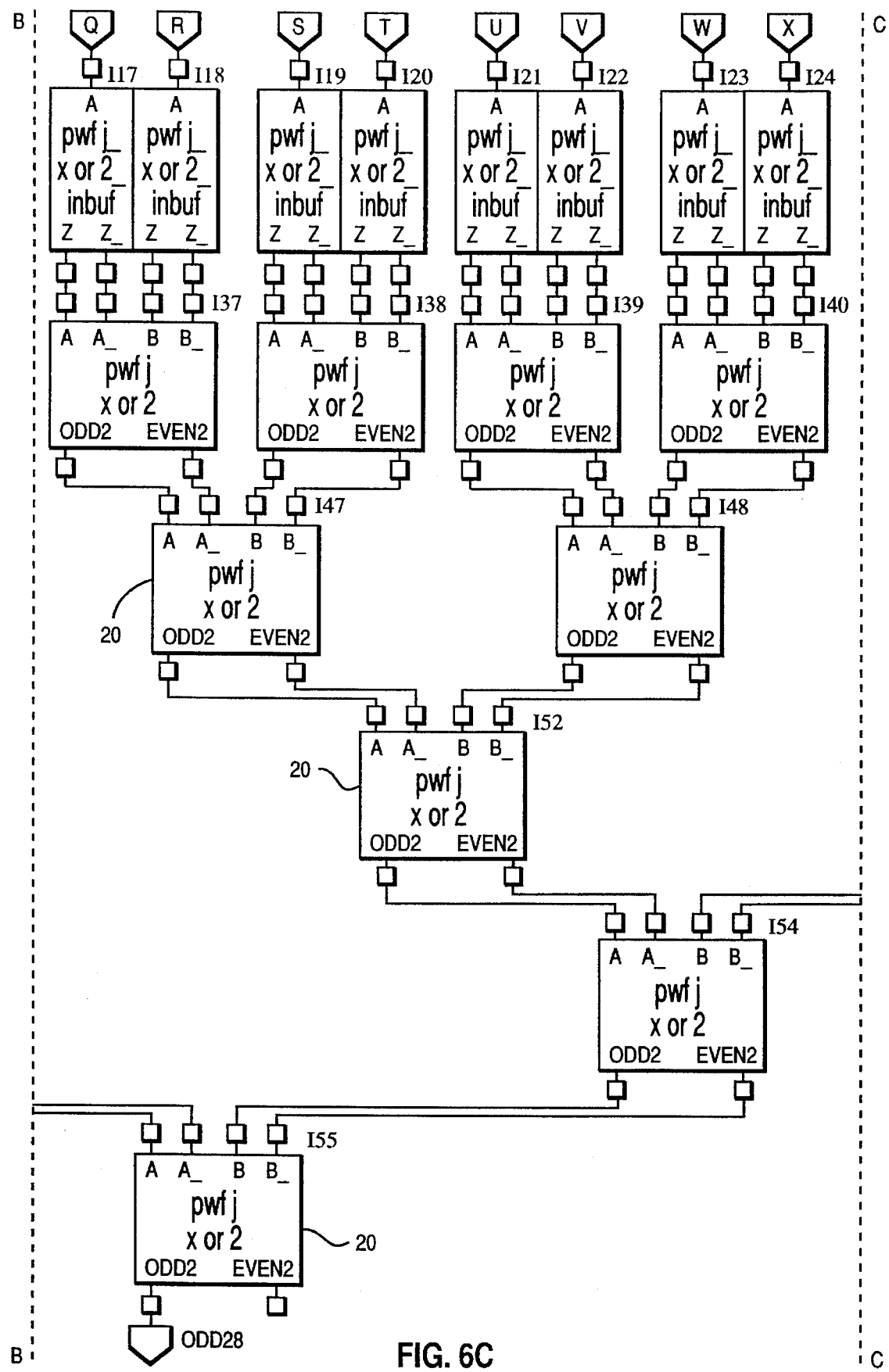
Figure 6D:
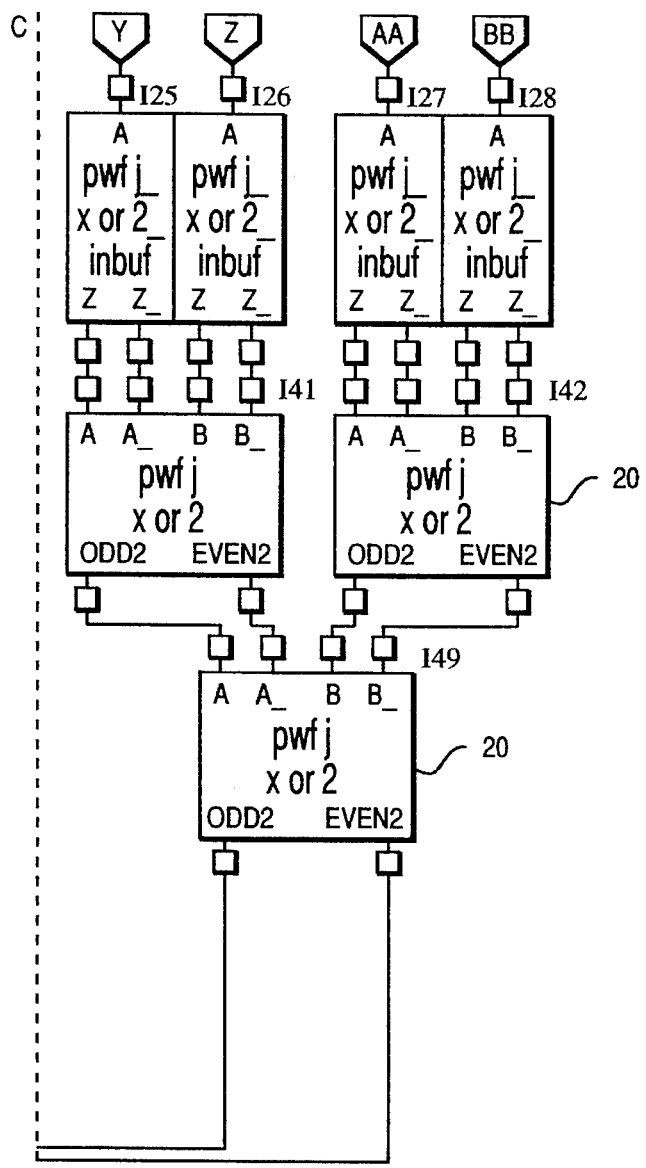

FIG. 5 illustrates the preferred embodiment of the present invention which is an easily implementable, small and power efficient XOR circuit. This XOR gate 20 includes four (4) functional NMOS transistors 21, 22, 23 and 24. It also includes two (2) functional inverters (devices 33–36) and two (2) "pull-up" PMOS transistors 31 and 32. The preferred embodiment of FIG. 5 is very symmetrical with identical input loading, output drive and propagation paths. When multiple XORs 20 are connected in a "tree" configuration, as shown in FIG. 6, transistors 21–24 in conjunction with the input connections create a "push-pull" XOR/EQV function which is buffered by the output inverters to the next connected stage. Transistors 31 and 32 provided the needed "pull" to get the internal nodes 37 and 38 to the power rail (Vdd). These transistors are not considered logically functional transistors. The input drain connections eliminate unnecessary delay between like stages. Using the previous conventions, an output drive capability of "5 micrometers", would have significantly reduced input loading. The transistors can be sized to tune the circuit of FIG. 5 to propagate logical 1's and 0's with substantially the same delay. Fan-out is much improved and the absence of large PMOS devices as logically functional NMOS device and small input devices cause the circuit to be much smaller in area and also much more power efficient than previous XOR gate designs. Testing has shown that the circuit of FIG. 5 has a propagation delay substantially equivalent to dynamic circuits, but with no requirement of synchronized inputs, reset logic, or the extensive and detailed design that is common with dynamic gates. That is, the XOR gate of the present invention operates independent of external reset logic, using only internal signals for operation.

The operation of the circuit of FIG. 5 will now be described with the following truth table (which is the same as used previously in conjunction with FIG. 3).

| A | A__ | B | B__ | C (XOR) | C__ (XNOR/EQV) |
|---|-----|---|-----|---------|----------------|
| 0 | 1 | 0 | 1 | 0 | 1 |
| 0 | 1 | 1 | 0 | 1 | 0 |
| 1 | 0 | 0 | 1 | 1 | 0 |
| 1 | 0 | 1 | 0 | 0 | 1 |

When A=0 and B=0, then A__=1 and B__=1, such that transistors 22 and 24 are turned on. Transistor 22 will cause node 38 to be a logical 1, due to the input of B__. Concurrently transistor 24 will cause a logical 0 to be placed on node 37, which will perform two functions. First, it will cause transistor 32 to be turned on and "pull" node 38 up to Vdd, thus, giving node 38 a strong logical 1 signal to input to the output inverter stage and cause transistor 34 to switch quickly and efficiently to output the logical 0 as the XOR signal. Second, the logical 0 on node 37 will cause transistor 35 to be turned on and output a logical 1, or Vdd, as the equivalent, or XNOR output.

In the case where A=0 and B=1, then A=1 and B=0, transistors 22 and 23 will be turned on. Transistor 22 will cause node 38 to be zero (0), thus turning on the inverter PMOS device 33 and outputting a logical 1 as signal C (XOR). Transistor 23 is also turned on and placing a relatively weak logical 1 one node 37, due to the input of A__. At the same time, the logical 0 on node 38 will cause "pull up" PMOS transistor 31 to be turned on, thereby placing a relatively strong logical 1 on node 37. The logical 1 on node 37 will cause transistor 36 to turn on, thus pulling the output C__ to zero (ground). When A=1, B=0 and A__=0, B__=1, then transistors 21 and 24 will be turned on. Node 38 will be pulled to ground since B is input to transistor 21. Node 37 will be pulled to a logical 1, by A, which is input to transistor 24. The logical 0 on node 38 will cause transistor 33, in the inverter, to turn on and output Vdd (logical 1) as signal C (XOR). At the same time, the zero (0) on node 38 will cause the pull up transistor 31 to turn on and directly place Vdd on node 37. This strong logical 1 will turn on transistor 36 and cause a logical 0 (ground) to be output as the C complement signal (XNOR).

Finally, in the case where A=1, B=1 and A__=0, B__=0, then transistors 21 and 23 will be turned on. Thus, a logical 1 will be placed on node 38, via transistor 21. Additionally, a logical 0 will be placed on node 37, through transistor 23. The logical 0 on node 37 will cause transistor 32 to turn on and pull up node 38 to Vdd. This will turn on inverter transistor 34 to output a logical 0 to the next stage as C (XOR). The logical 0 on node 37 will also cause transistor 35 to turn on and output a logical 1 as C__ (XNOR).

Those skilled in the art will understand how the use of only NMOS transistors for the functional logic of the circuit of FIG. 5, coupled with the inverter transistors 33, 34 (XOR), 35, 36 (XNOR) and pull up devices 31 and 32, will create a low power, efficient, static XOR circuit that can be used in many applications. In particular, the circuit of FIG. 5 is particularly useful when connected ill a tree configuration as shown in FIG. 6, which is a plurality of XOR gates 20 connected to one another in a tree configuration. This configuration is commonly used in error checking and correction (ECC), comparator and parity logic circuits. The advantages of efficiency, low power consumption, and the like, of the present invention are increased when the XOR gate of the present invention is connected in a manner such as shown in FIG 6.

Although certain preferred embodiments have been shown and described, it should be understood that many changes and modification may be made therein without departing from the scope of the appended claims.

We claim:

1. A circuit including a plurality of interconnected XOR devices, each XOR device, comprising:

means for receiving input logic signals;

means, including only NMOS devices, for generating a first and a second XOR signal based only upon said input logic signals provided to said NMOS devices;

a first node, connected to said generating means, for providing said first XOR logic signal to a first output circuit;

first means for connecting said first node to a voltage supply in response to said input logic signals, when said first XOR logic signal input to said first output circuit is a logical one;

a second node, connected to said generating means, for providing said second XOR logic signal to a second output circuit wherein the second XOR logic signal on the second node is the complement of the first XOR logic signal on the first node; and second means for connecting said second node to said voltage supply in response to said input logic signals, when said second XOR logic signal input to said second output circuit is a logical one;

wherein a first output signal and a second output signal from said first and second output circuits, respectively, are provided to another means for receiving input logic signals, included in another of said plurality of interconnected XOR devices; and wherein said first and second output circuits include inverters for buffering the first and second XOR signals prior to their output as the first and second output signals to said another of the plurality of interconnected XOR devices.

2. A circuit according to claim 1 wherein said first and second output circuits push said first and second output signals by causing a strong voltage signal to be present for a logical one signal and ground potential to be present for a logical zero.

3. A circuit according to claim 2 wherein said means for connecting further comprises:

a first PMOS transistor connected between said voltage supply and said second node, said first node being connected to the gate of said first PMOS transistor; and a second PMOS transistor connected between said voltage supply and said first node, said second node being connected to the gate of said second PMOS transistor.

4. A circuit according to claim 3 wherein said means for generating comprises:

a first and a second NMOS transistors connected to said first node; and a third and a fourth NMOS transistors connected said second node.

5. A method of interconnecting a plurality of XOR devices, comprising the steps of:

receiving, by one of said plurality of XOR devices, input logic signals;

generating a first and a second XOR signal based only upon input logic signals provided to only NMOS devices;

supplying, on a first node connected to a first portion of said NMOS devices, said first XOR signal to a first output circuit;

connecting said first node to a voltage supply in response to said input logic signals, when said first XOR signal input to said first output circuit is a logical one;

supplying, on a second node connected to a second portion of said NMOS devices, said second XOR logic signal to a second output circuit wherein the second XOR signal on the second node is the complement of the first XOR signal on the first node;

connecting said second node to said voltage supply in response to said input logic signals, when said second XOR signal input to said second output circuit is a logical one; and providing a first output signal and a second output signal from said first and second output circuits, respectively, to another means for receiving input logic signals, included in another of said plurality of interconnected XOR devices;

wherein said first and second output circuits include inverters for buffering the first and second XOR signals prior to their output as the first and second output signals to said another of the plurality of interconnected XOR devices.

6. A method according to claim 5, further comprising the step of pushing said first and second output signals to said another of said plurality of interconnected XOR devices by causing a strong voltage signal to be present for a logical one, and ground potential to be present for a logical zero.

7. A method according to claim 6 wherein said step of connecting further comprises the steps of:

provliding a first PMOS transistor connected between said voltage supply and said second node, said first node being connected to the gate of said first PMOS transistor; and providing a second PMOS transistor connected between said voltage supply and said first node, said second node being connected to the gate of said second PMOS transistor.

8. A method according to claim 7 wherein said step of generating comprises:

providing a first and a second NMOS transistors connected to said first node; and providing a third and a four NMOS transistors connected said second node.

* * * * *